US012773045B2

(12) United States Patent
Charapale et al.

(10) Patent No.: US 12,773,045 B2
(45) Date of Patent: Oct. 27, 2026

(54) SEISMIC SUPPORTS

(71) Applicant: VERTIV CORPORATION, Westerville, OH (US)

(72) Inventors: Utkarsh Diliprao Charapale, Kolhapur (IN); Srinivasan Natarajan, Erode (IN); Jin Elkins, Auburn, AL (US)

(73) Assignee: Vertiv Corporation, Westerville, OH (US)

( * ) Notice: Subject to any disclaimer, the term of this patent is extended or adjusted under 35 U.S.C. 154(b) by 64 days.

(21) Appl. No.: 18/823,681

(22) Filed: Sep. 4, 2024

(65) Prior Publication Data

US 2025/0072607 A1 Mar. 6, 2025

(30) Foreign Application Priority Data

Sep. 4, 2023 (IN) ............................ 202321059238

(51) Int. Cl.

| | |
|---|---|
| ***A47B 91/16*** | (2006.01) |
| ***A47B 91/04*** | (2006.01) |
| ***A47B 97/00*** | (2006.01) |
| ***H05K 5/02*** | (2006.01) |

(52) U.S. Cl.

CPC .............. *A47B 91/16* (2013.01); *A47B 91/04* (2013.01); *H05K 5/0234* (2013.01); *A47B 2097/008* (2013.01)

(58) Field of Classification Search

CPC ....... A47B 91/005; A47B 91/04; A47B 91/08; A47B 91/16; A47B 2097/008; A47B 88/50; A47B 2210/0086; A47B 2220/0027; H05K 5/0234

See application file for complete search history.

(56) References Cited

U.S. PATENT DOCUMENTS

| | | | | | |
|---|---|---|---|---|---|
| 2,018,264 | A * | 10/1935 | Jones | A47B 91/12 | 248/346.11 |
| 4,644,714 | A * | 2/1987 | Zayas | E04H 9/021 | 248/562 |
| 4,726,161 | A * | 2/1988 | Yaghoubian | E04H 9/023 | 52/167.6 |
| 4,883,250 | A * | 11/1989 | Yano | F16F 15/02 | 52/167.6 |
| 4,965,895 | A * | 10/1990 | Shustov | A47C 31/002 | 5/2.1 |
| 4,974,378 | A * | 12/1990 | Shustov | E02D 27/34 | 52/167.3 |
| 5,310,156 | A * | 5/1994 | Matsumura | A47B 91/00 | 248/188.9 |
| 5,599,106 | A * | 2/1997 | Kemeny | F16C 29/04 | 384/36 |
| 6,321,492 | B1 * | 11/2001 | Robinson | F16F 7/015 | 52/167.6 |

(Continued)

FOREIGN PATENT DOCUMENTS

| | | | | |
|---|---|---|---|---|
| KR | 20180051067 A * | 5/2018 | | A47B 91/04 |
| KR | 101946382 B1 * | 2/2019 | | H05K 5/0234 |

*Primary Examiner* — Andrew Roersma

(74) *Attorney, Agent, or Firm* — Mackey Law Firm PLLC

(57) ABSTRACT

A cabinet can include a body for housing electronic equipment, a plurality of legs extending downwardly from the body, with each leg secured to a different bottom corner of the body, a plurality of balls, each ball secured to one of the legs, and a plurality of support cups configured to be secured to a support surface.

20 Claims, 14 Drawing Sheets

(56) References Cited

U.S. PATENT DOCUMENTS

| | | | | |
|---|---|---|---|---|
| 9,399,865 | B2 * | 7/2016 | Hubbard | E04B 1/98 |
| 2005/0100253 | A1 * | 5/2005 | Chang | F16F 15/02<br>384/36 |
| 2005/0116134 | A1 * | 6/2005 | Lee | D06F 37/20<br>248/650 |

* cited by examiner

SEISMIC SUPPORTS

CROSS-REFERENCE TO RELATED APPLICATIONS

This application claims the benefit of Indian provisional patent application No. 202321059238 filed Sep. 4, 2023, the entire contents of which are incorporated herein by reference.

TECHNICAL FIELD

The present disclosure relates generally to electronic equipment cabinets and more specifically relates to seismic supports for electronic equipment cabinets.

BACKGROUND

Outside Plant (OSP) cabinets are exposed to various environmental conditions, which can include earthquakes. In at least some cases, such electronic equipment cabinets need to meet seismic requirements for the area or location where they are intended to be installed.

Existing cabinet designs may have a stud structure or plinth structure upon which a cabinet is mounted. The entire weight of the cabinet may rest on the supporting structure, which is typically fixed to the ground or floor. A physical imbalance of the supporting structure can happen whenever there is an external force applied, such as an earthquake or other vibration, which can disturb the supporting structure and generate movement in the supporting structure. This vibration and/or movement can be transferred to a cabinet, which can cause the cabinet to lose its stability and/or suffer relatively high movement and/or stress. A resulting cabinet failure can damage the equipment installed within the cabinet and/or interrupt the operation thereof. Some cabinets include additional structure for increased stiffness, etc., in an effort to overcome or guard against such issues. However, such approaches can increase the cabinet cost and weight.

SUMMARY

Applicant has created new and useful devices, systems and methods for seismic supports for electronic equipment cabinets. In at least one embodiment, a cabinet for housing electronic equipment can include a body for housing the electronic equipment, a plurality of support cups for being secured to a surface or structure supporting the cabinet, a plurality of legs, and a plurality of balls for cooperating with the support cups to minimize or eliminate adverse effects on the cabinet or its contents from vibration or outside forces acting on the cabinet or a structure supporting the cabinet.

In at least one embodiment, a cabinet for housing electronic equipment can be mounted to a support surface and can include a body for housing the electronic equipment, a plurality of support cups secured to the support surface, a plurality of legs extending downwardly from the body, a plurality of balls, or any combination thereof. In at least one embodiment, each ball can be secured to one of the legs and/or can rest in one of the cups. In at least one embodiment, a cabinet for housing electronic equipment can include four support cups, four balls, four legs, or any combination thereof. In at least one embodiment, one or more of the legs can be secured to one of four bottom corners of the body of the cabinet.

In at least one embodiment, one or more of the support cups can include a concave upper surface configured to receive one of the balls. In at least one embodiment, one or more of the concave upper surfaces can be symmetrically curved in two dimensions. In at least one embodiment, one or more of the support cups can include a perimeter rim or other stop configured to retain the ball within the perimeter or boundary of the concave upper surface. In at least one embodiment, one or more of the support cups can include a resilient boot sealing the concave upper surface to the cabinet. In at least one embodiment, one or more of the support cups can include a lubricant within the boot. In at least one embodiment, the lubricant can provide lubrication between the ball and the concave upper surface.

In at least one embodiment, one or more of the legs can be rigid. In at least one embodiment, one or more of the legs can be rigidly affixed to the cabinet. In at least one embodiment, one or more of the legs can be rigidly affixed to a bottom surface of the cabinet. In at least one embodiment, each of the legs can be rigidly affixed to a different corner of the bottom surface of the cabinet.

In at least one embodiment, one or more of the legs can be flexible and/or flexibly mounted to the cabinet, such as to a different corner of the bottom surface of the cabinet. In at least one embodiment, one or more of the legs can extend downward from the cabinet, perpendicular from a bottom surface of the cabinet. In at least one embodiment, one or more of the legs can be biased to extend downward from the cabinet, perpendicular from a bottom surface of the cabinet, by the leg's resiliency.

In at least one embodiment, one or more of the legs can be rigid and flexibly mounted to the cabinet. In at least one embodiment, one or more of the legs can be flexibly mounted to the cabinet through one or more rotating joints. In at least one embodiment, one or more of the rotating joints can be configured to rotate about one or more axes. In at least one embodiment, two or more of the axes can be parallel. In at least one embodiment, one or more of the rotating joints can be configured to rotate about two perpendicular axes. In at least one embodiment, one or more of the legs can be biased towards a rest position by one or more springs.

In at least one embodiment, one or more of the balls can include a curved surface configured to contact a corresponding one of the plurality of support cups. In at least one embodiment, the curved surface can be at least partially semispherical. In at least one embodiment, one or more of the balls can be configured to pivot in one or more directions relative to a corresponding one of the plurality of support cups. In at least one embodiment, one or more of the balls can be configured to pivot in multiple directions relative to a corresponding one of the plurality of support cups. In at least one embodiment, one or more of the balls can be configured to roll in one or more directions relative to a corresponding one of the plurality of support cups. In at least one embodiment, one or more of the balls can be configured to roll in multiple directions relative to a corresponding one of the plurality of support cups.

In at least one embodiment, a cabinet for housing electronic equipment can be mounted to a support surface and can include a body for housing the electronic equipment, four legs extending downwardly from the body, four balls, four support cups configured to receive one of the balls, or any combination thereof. In at least one embodiment, one or more of the legs can be secured to a different bottom corner of the body. In at least one embodiment, one or more of the balls can be secured to one of the legs. In at least one embodiment, one or more of the support cups can be secured to the support surface in a rectangular pattern, such as matching an on-center spacing of the legs. In at least one embodiment, one or more of the support cups can include a symmetrically curved concave upper surface configured to receive one of the balls. In at least one embodiment, one or more of the support cups can includes a resilient boot sealing lubricant within the concave upper surface. In at least one embodiment, one or more of the legs can be flexibly mounted to the cabinet. In at least one embodiment, one or more of the legs can be biased to extend downward from the cabinet, such as perpendicular from a bottom surface of the cabinet.

DETAILED DESCRIPTION

Figure 1:
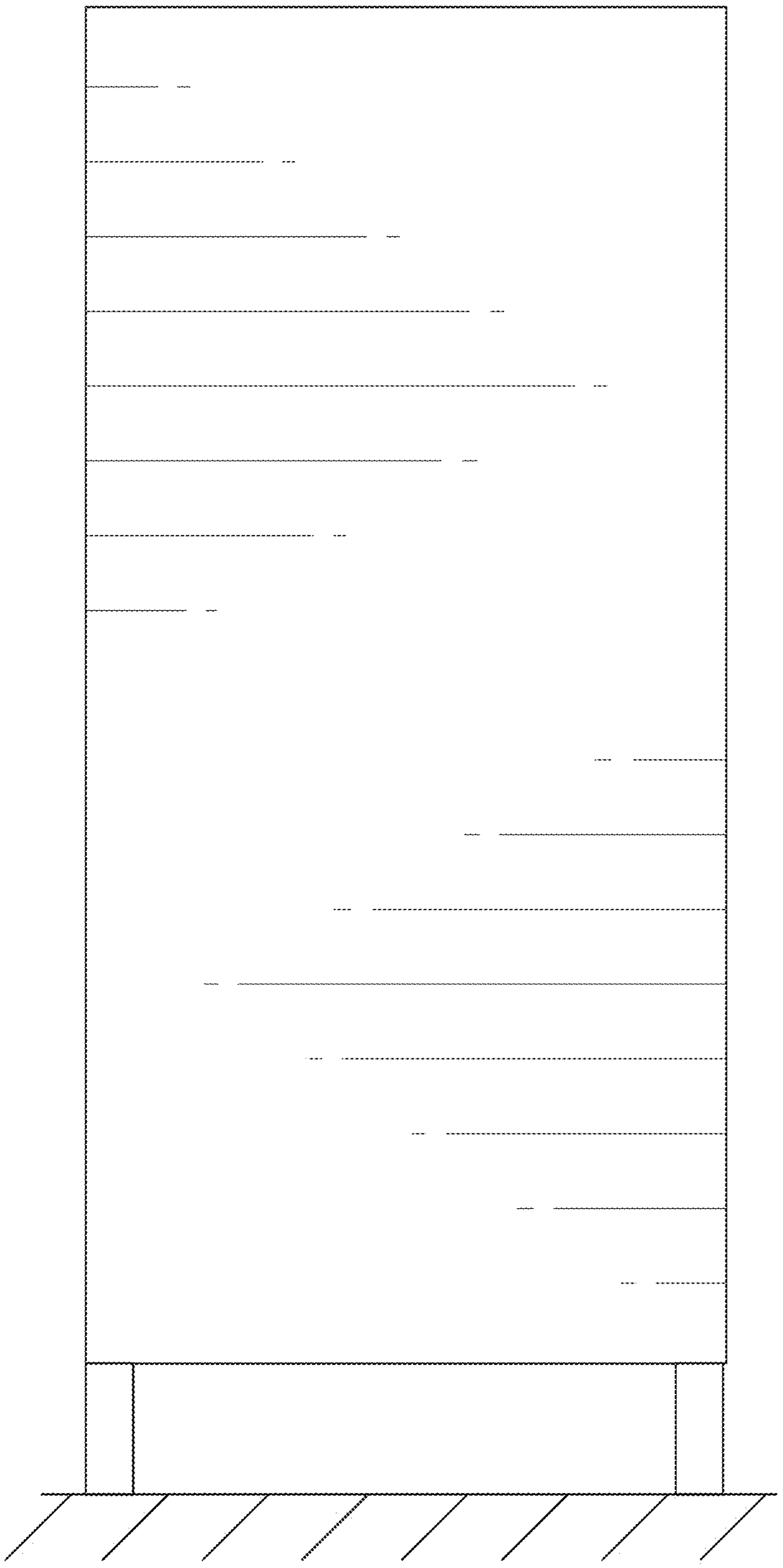
FIG. 1 (Prior Art)
FIG. 1 is an elevation view of one of many embodiments of a currently available electronics equipment cabinet.

The figures described above and the written description of specific structures and functions below are not presented to limit the scope of what Applicant has invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Any process flowcharts discussed herein illustrate the operation of possible implementations of systems, methods, and computer program products according to various embodiments of the present disclosure. In this regard, each block in a flowchart may represent a module, segment, or portion of code, which can include one or more executable instructions for implementing the specified logical function(s). It should also be noted that, in some implementations, the function(s) noted in the block(s) might occur out of the order depicted in the figures. For example, blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Applicant has created new and useful devices, systems and methods for seismic supports for electronic equipment cabinets. In at least one embodiment, a cabinet for housing electronic equipment can include a body for housing the electronic equipment, a plurality of support cups for being secured to a surface or structure supporting the cabinet, a plurality of legs, and a plurality of balls for cooperating with the support cups to minimize or eliminate adverse effects on the cabinet or its contents from vibration or outside forces acting on the cabinet or a structure supporting the cabinet.

Figure 2:
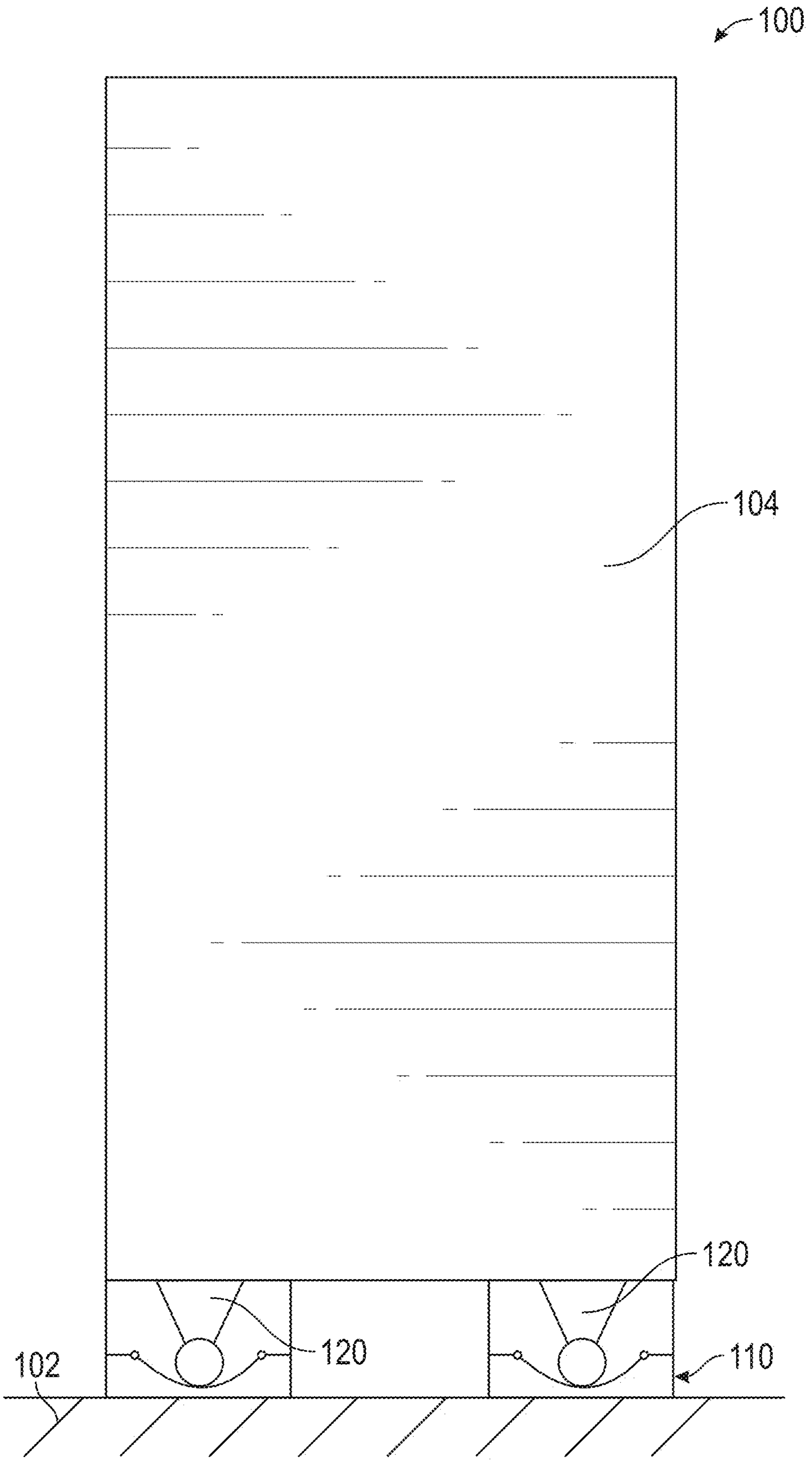
FIG. 2 is an elevation view of one of many embodiments of an electronic equipment cabinet with seismic supports according to the disclosure.
Figure 3:
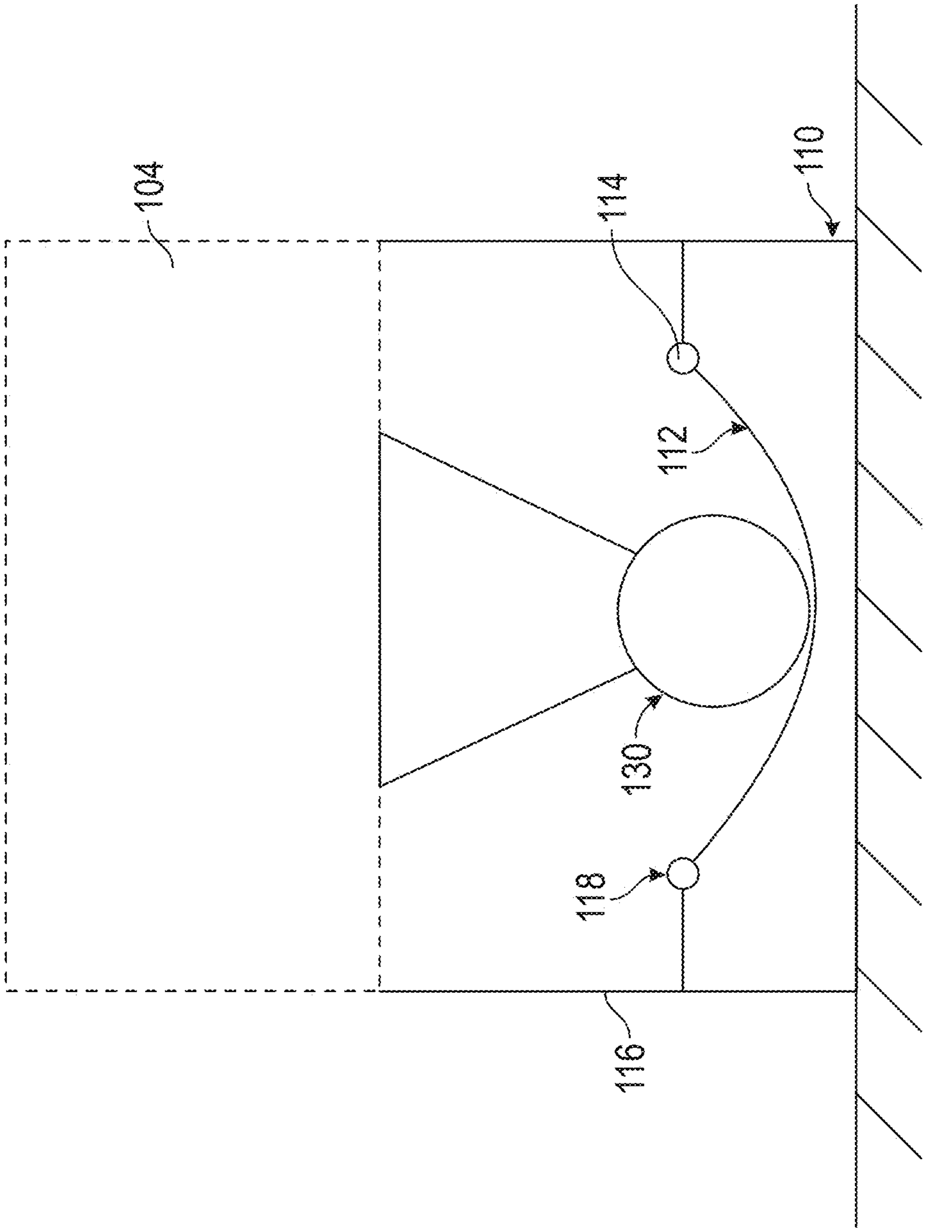
FIG. 3 is a close-up elevation view of the seismic supports of FIG. 2.
Figure 4:
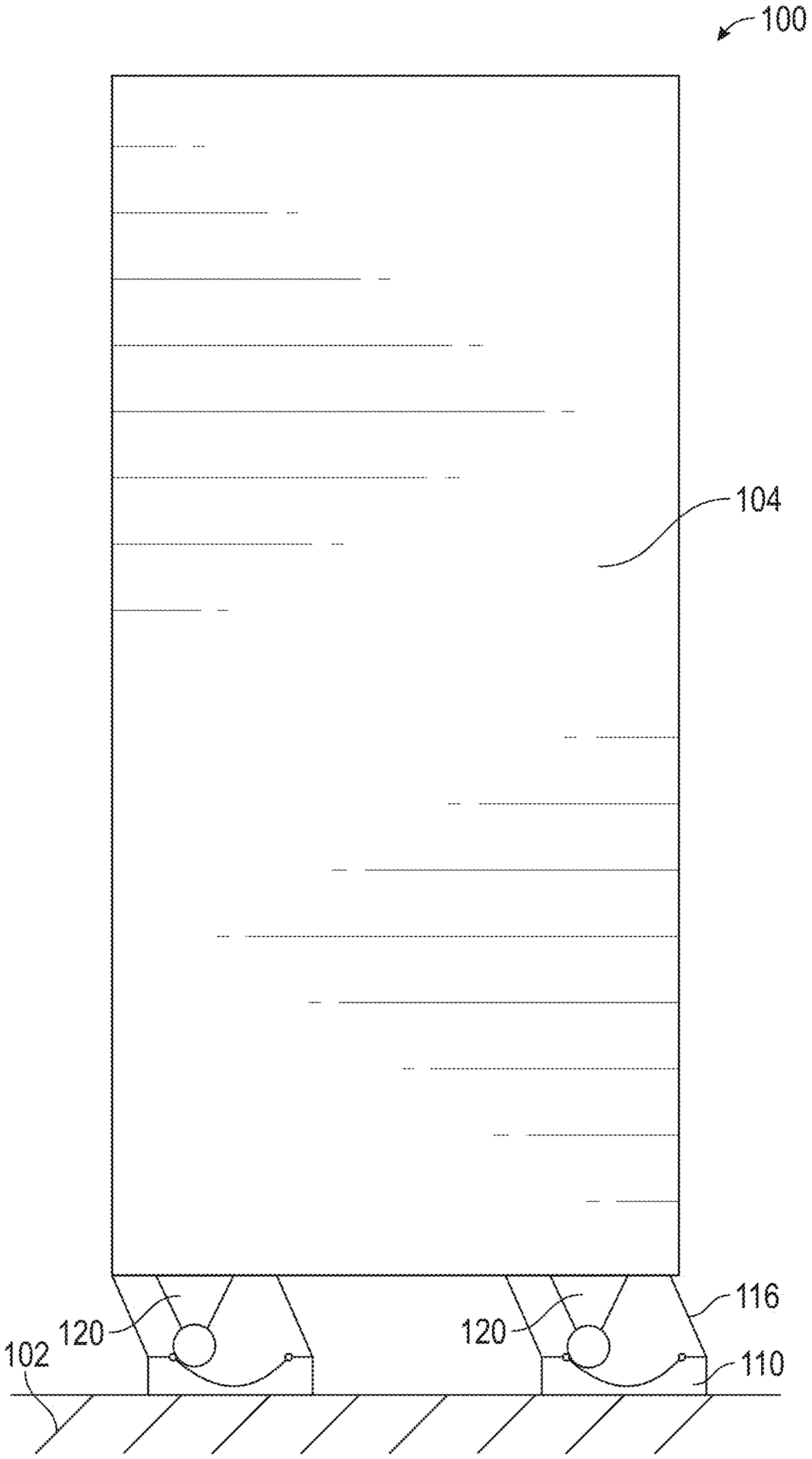
FIG. 4 is an elevation view of the electronic equipment cabinet of FIG. 2, shown with displacement in one direction.
Figure 5:
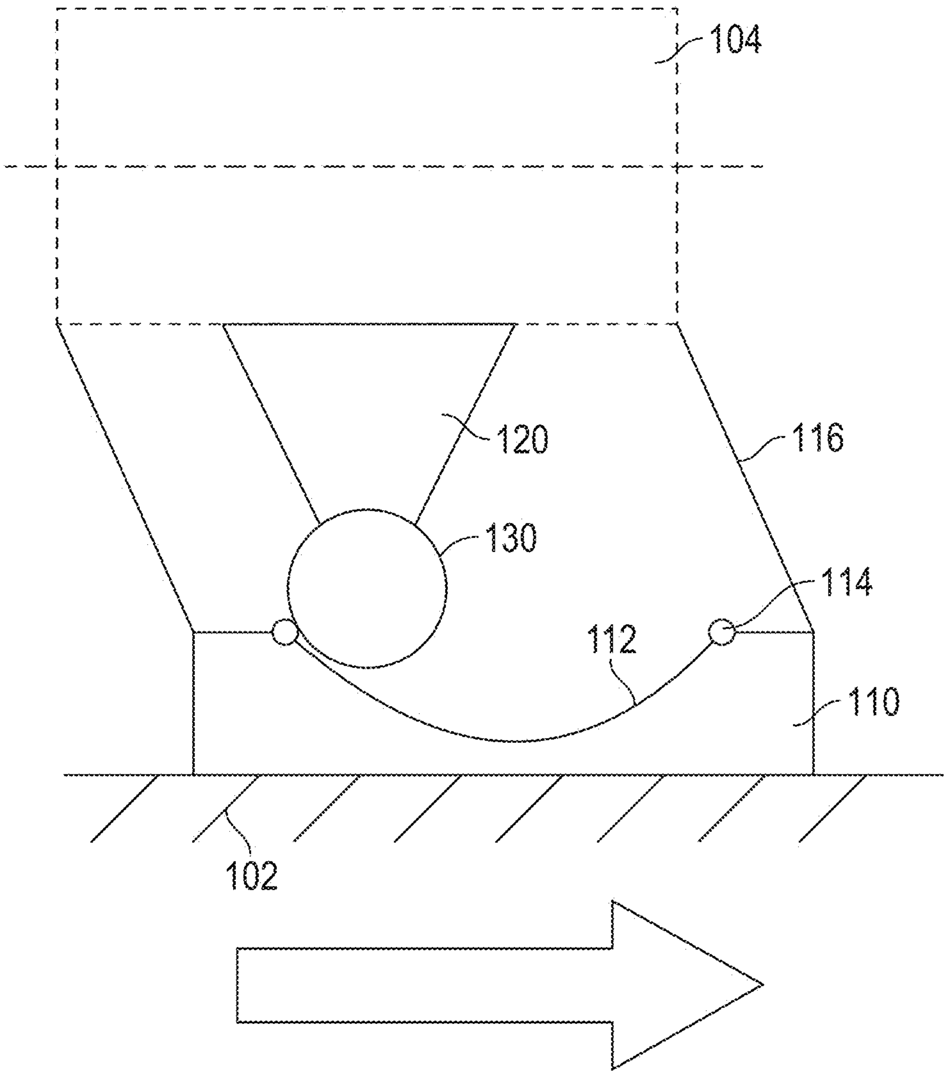
FIG. 5 is a close-up elevation view of the seismic supports of FIG. 4.
Figure 6:
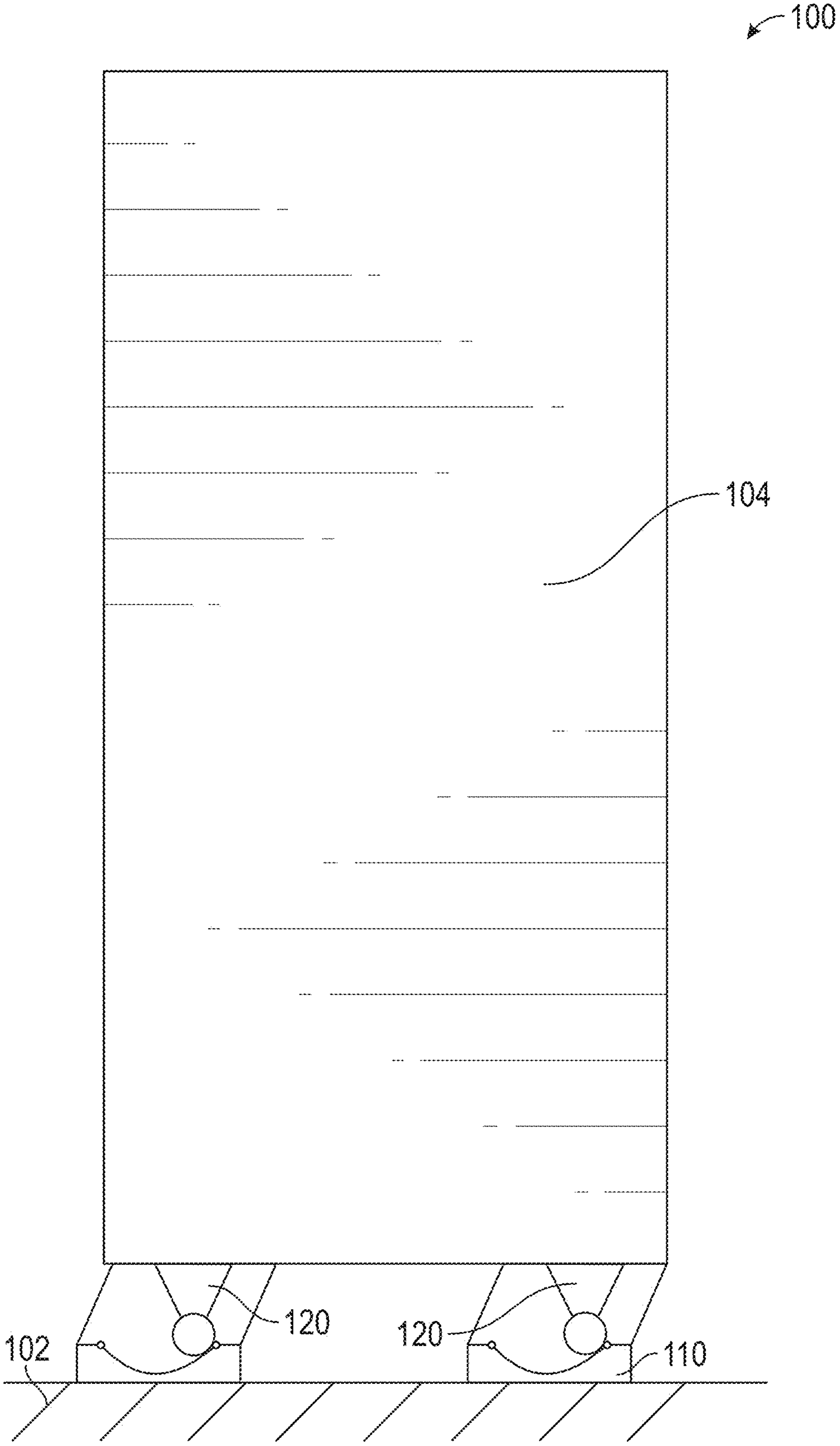
FIG. 6 is an elevation view of the electronic equipment cabinet of FIG. 2, shown with displacement in another direction.
Figure 7:
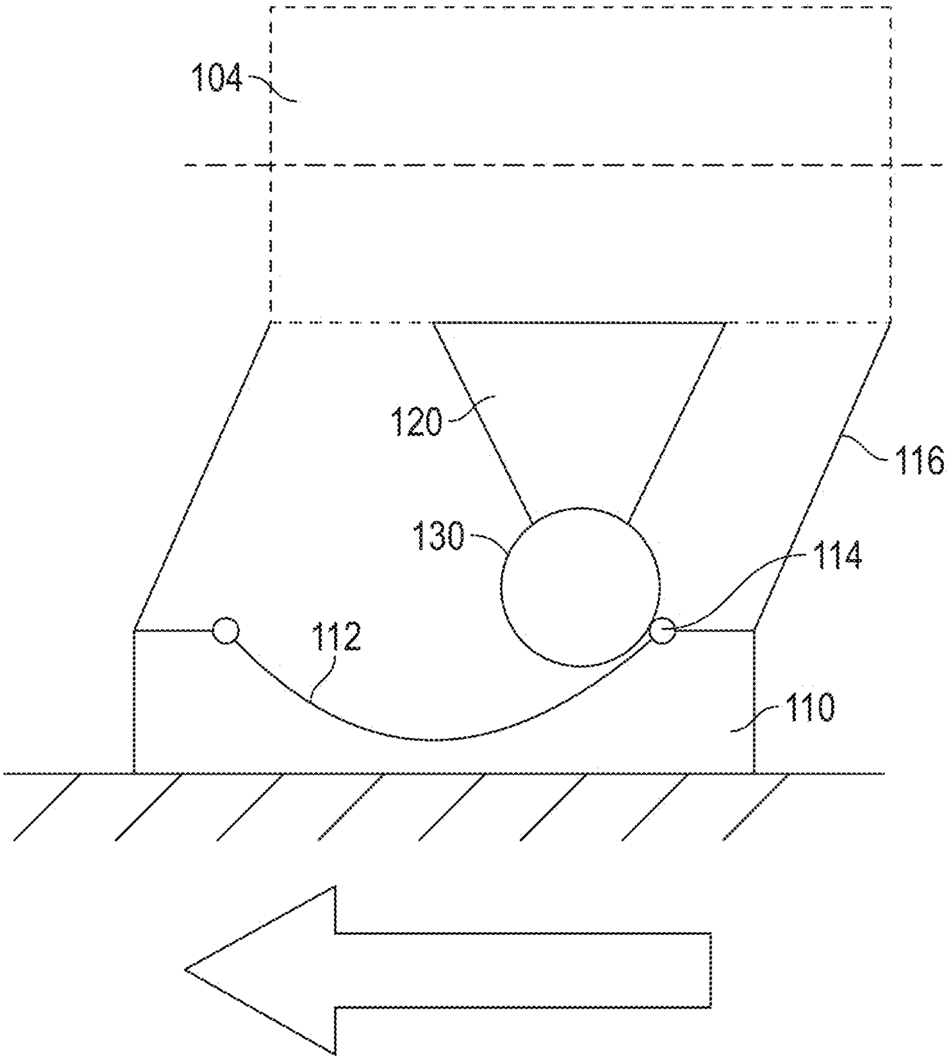
FIG. 7 is a close-up elevation view of the seismic supports of FIG. 6.
Figure 8:
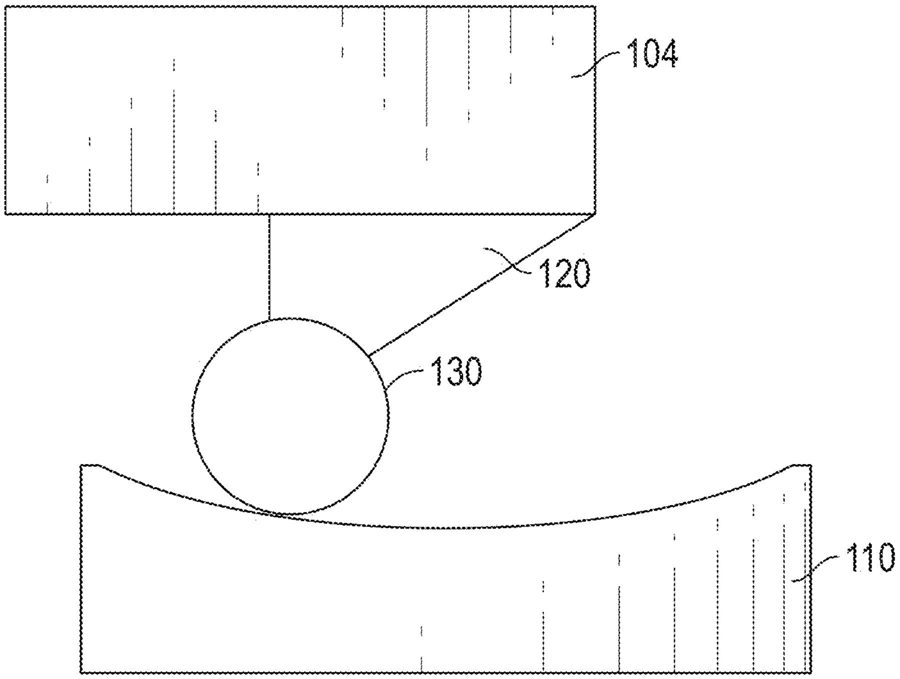
FIG. 8 is a close-up elevation view of one of many embodiments of seismic supports according to the disclosure.
Figure 9:
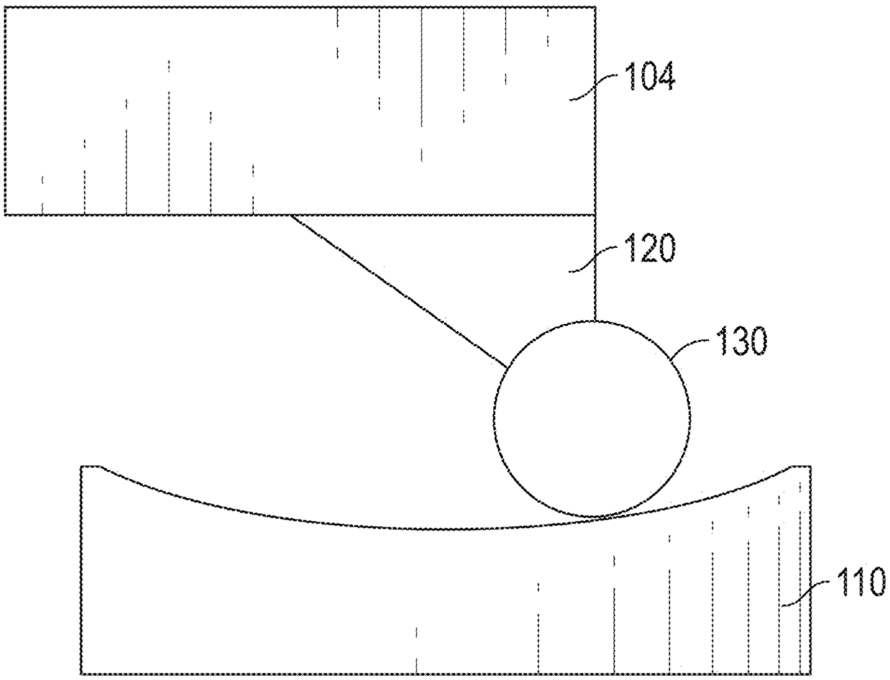
FIG. 9 is a close-up elevation view of the seismic supports of FIG. 8.
Figure 10:
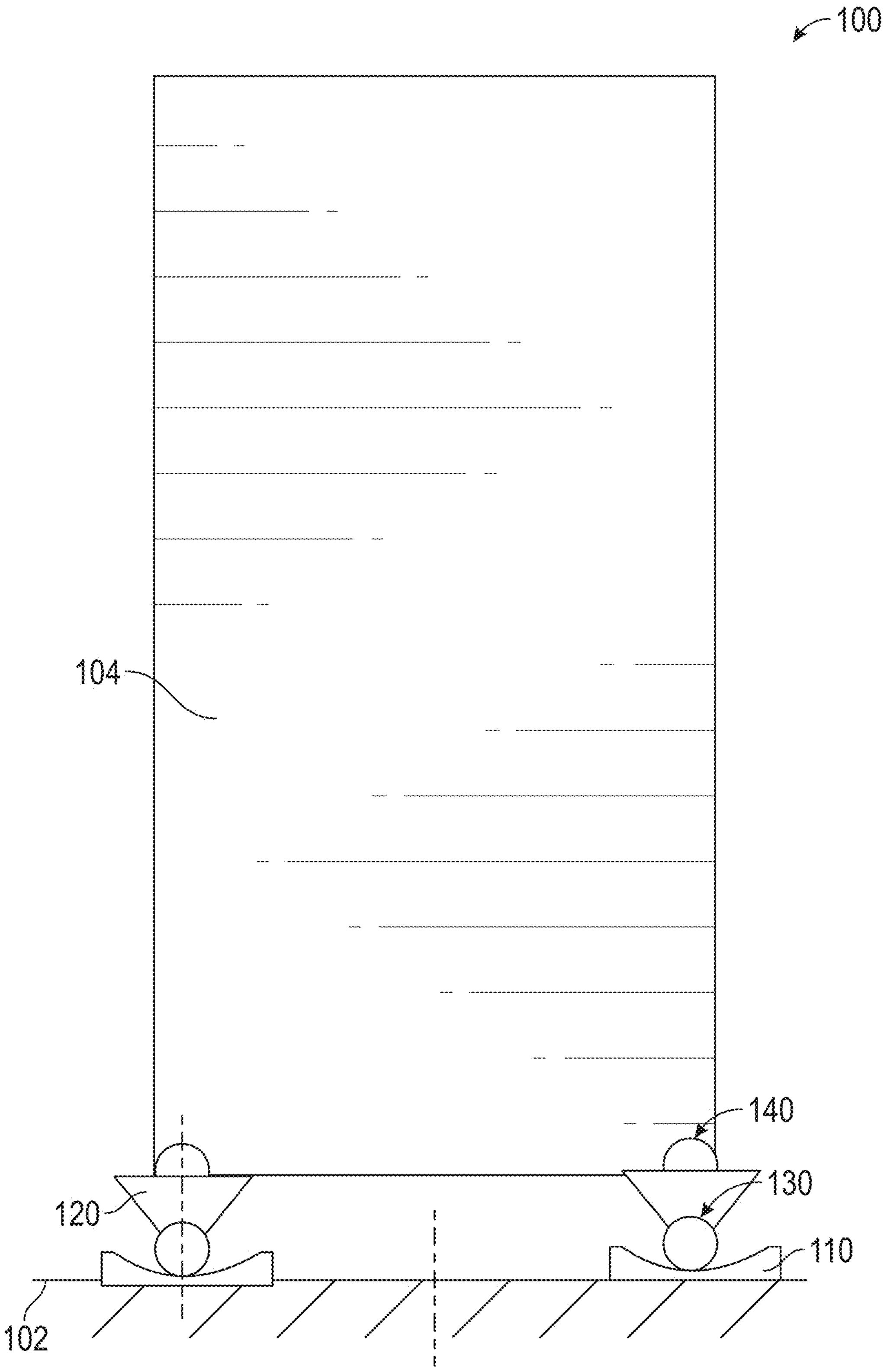
FIG. 10 is an elevation view of another one of many embodiments of an electronic equipment cabinet with seismic supports according to the disclosure.
Figure 11:
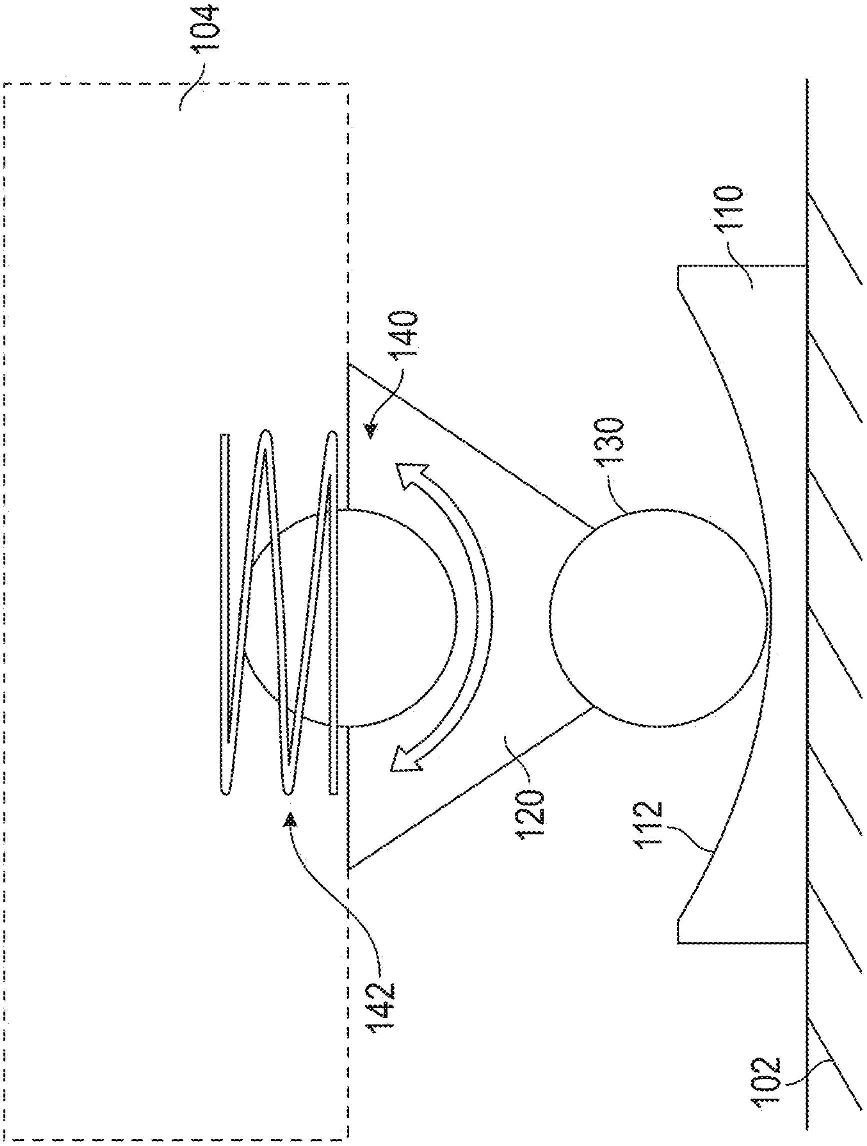
FIG. 11 is a close-up elevation view of the seismic supports of FIG. 10.
Figure 12:
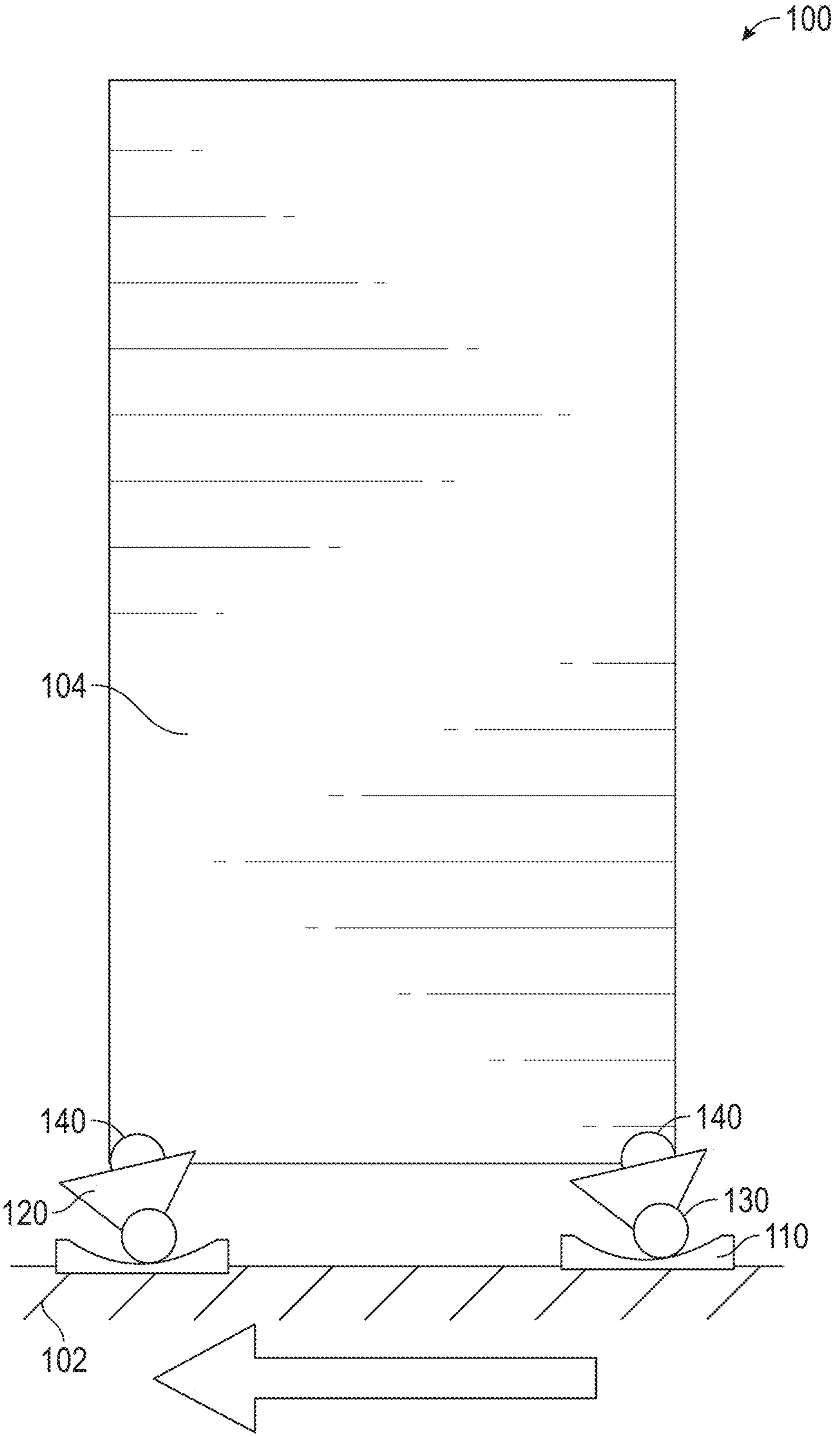
FIG. 12 is an elevation view of the electronic equipment cabinet of FIG. 10, shown with displacement in one direction.
Figure 13:
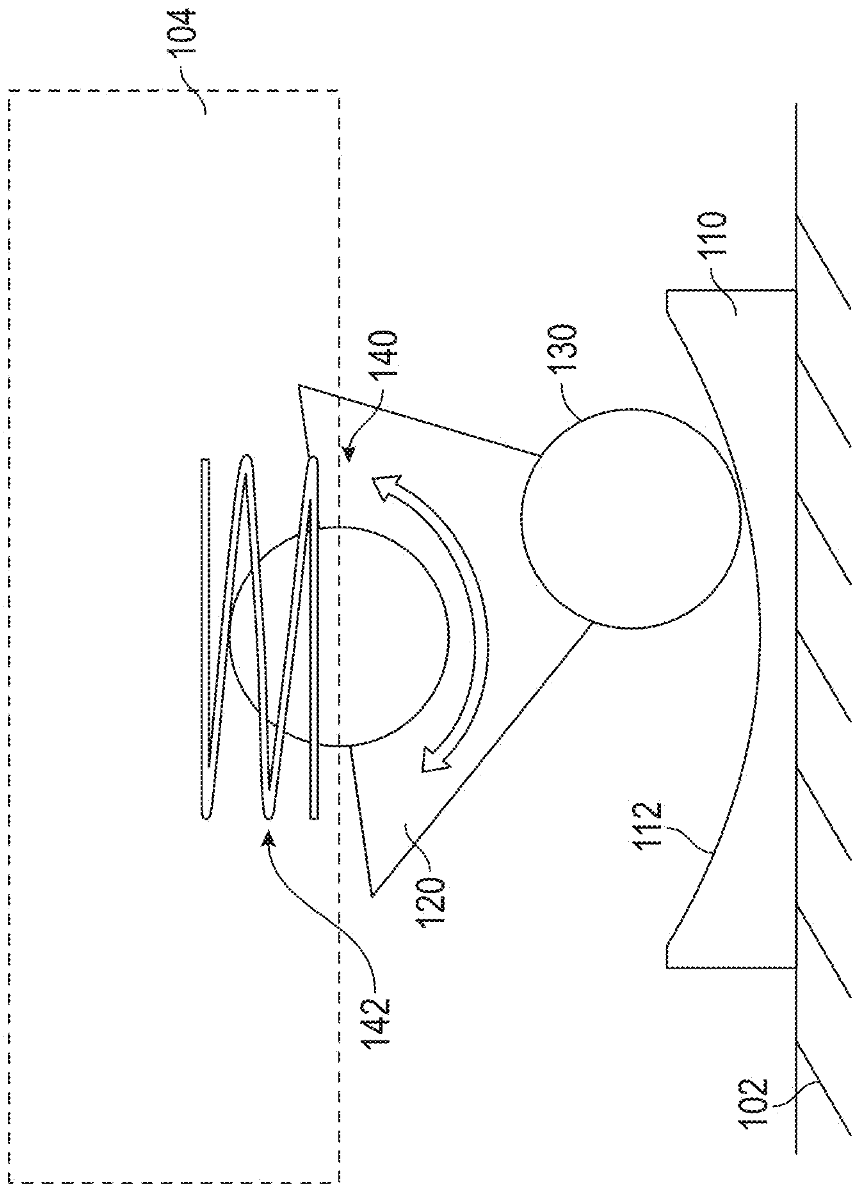
FIG. 13 is a close-up elevation view of the seismic supports of FIG. 12.
Figure 14:
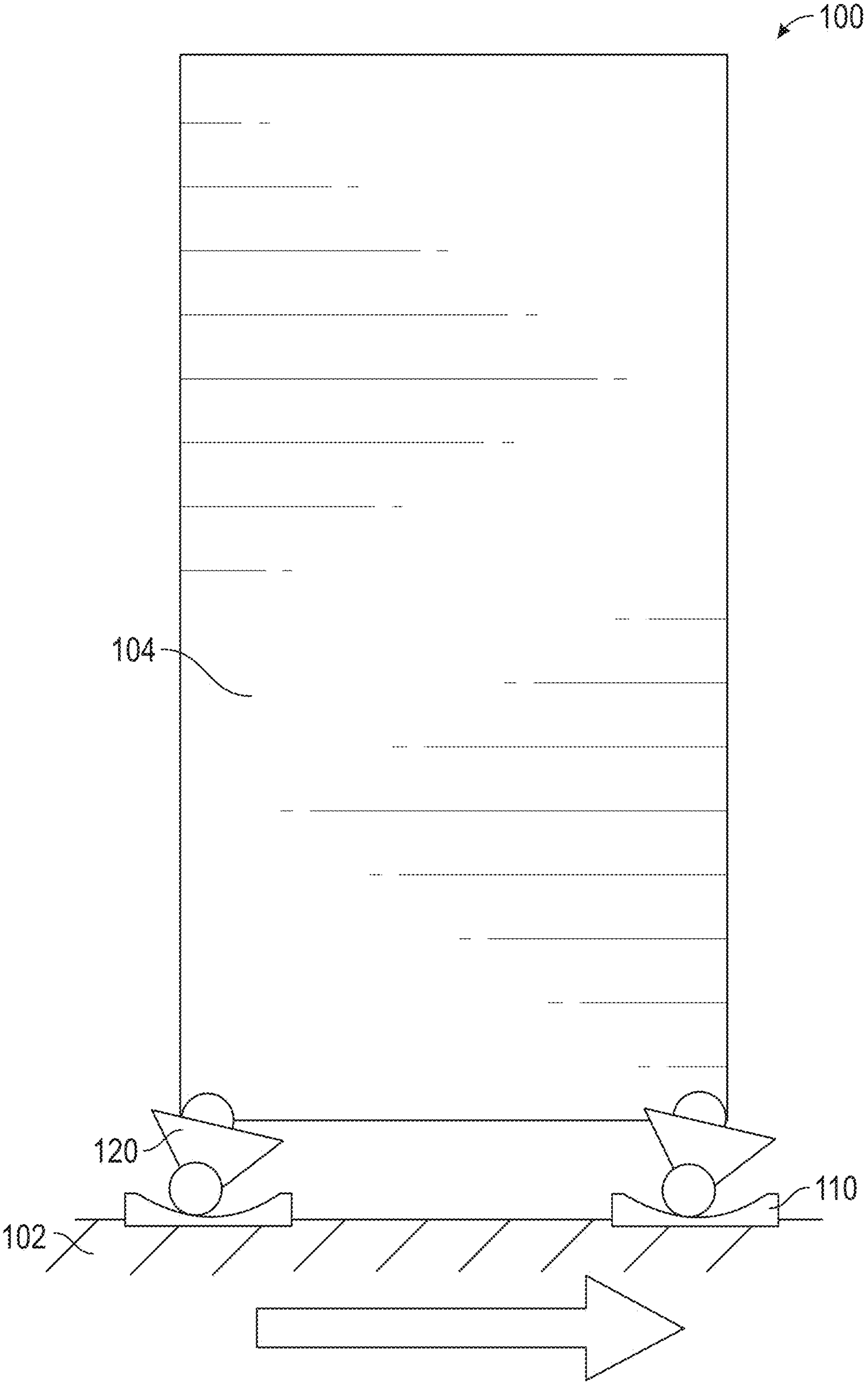
FIG. 14 is an elevation view of the electronic equipment cabinet of FIG. 10, shown with displacement in another direction.
Figure 15:
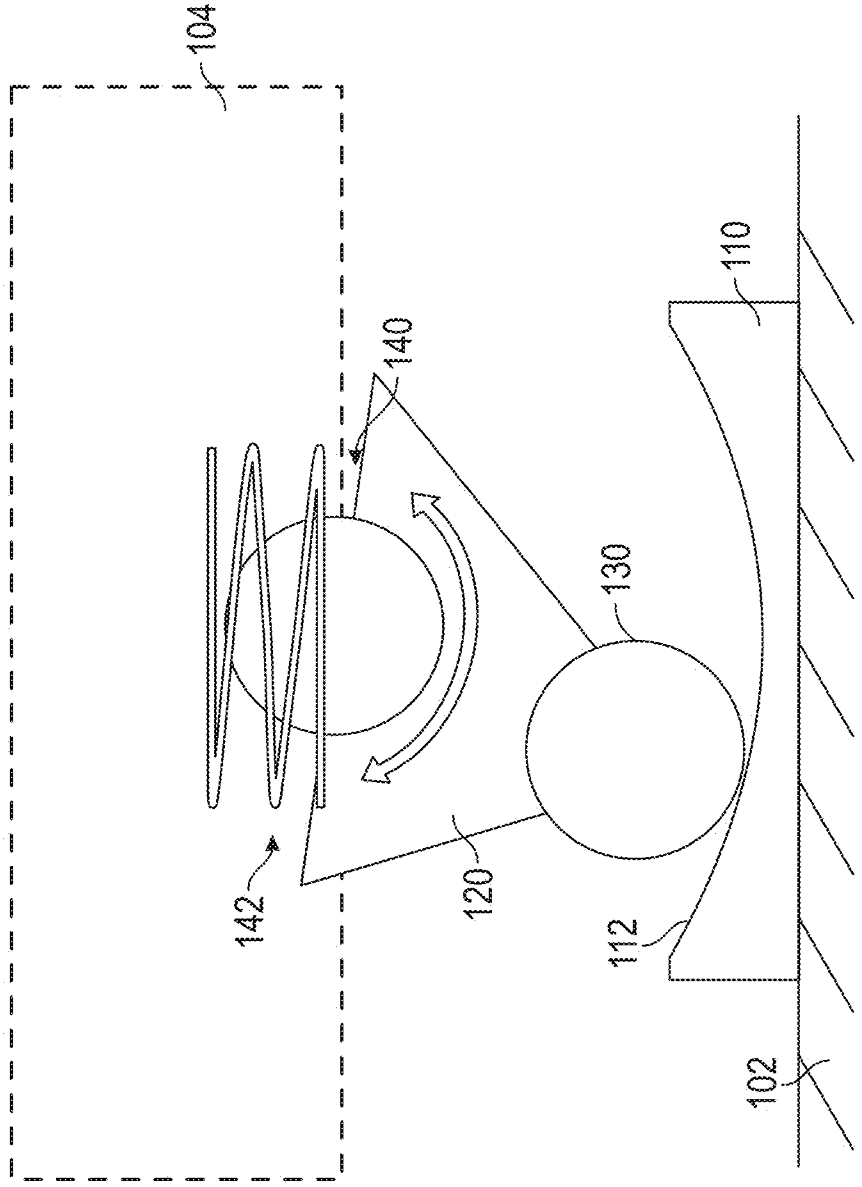
FIG. 15 is a close-up elevation view of the seismic supports of FIG. 14.

FIG. 2 is an elevation view of one of many embodiments of an electronic equipment cabinet with seismic supports according to the disclosure. FIG. 3 is a close-up elevation view of the seismic supports of FIG. 2. FIG. 4 is an elevation view of the electronic equipment cabinet of FIG. 2, shown with displacement in one direction. FIG. 5 is a close-up elevation view of the seismic supports of FIG. 4. FIG. 6 is an elevation view of the electronic equipment cabinet of FIG. 2, shown with displacement in another direction. FIG. 7 is a close-up elevation view of the seismic supports of FIG. 6. FIG. 8 is a close-up elevation view of one of many embodiments of seismic supports according to the disclosure. FIG. 9 is a close-up elevation view of the seismic supports of FIG. 8. FIG. 10 is an elevation view of another one of many embodiments of an electronic equipment cabinet with seismic supports according to the disclosure. FIG. 11 is a close-up elevation view of the seismic supports of FIG. 10. FIG. 12 is an elevation view of the electronic equipment cabinet of FIG. 10, shown with displacement in one direction. FIG. 13 is a close-up elevation view of the seismic supports of FIG. 12. FIG. 14 is an elevation view of the electronic equipment cabinet of FIG. 10, shown with displacement in another direction. FIG. 15 is a close-up elevation view of the seismic supports of FIG. 14. FIGS. 2-15 are described in conjunction with one another.

In at least one embodiment, a cabinet 100, such as for housing electronic equipment, can be mounted to a support surface 102 and can include a body 104, such as for housing the electronic equipment. In at least one embodiment, the electronic equipment can include computer servers, data storage devices, telecommunications equipment, power supplies, networking equipment, other electronics, or any combination thereof. In at least one embodiment, the support surface 120 can be a floor, a plinth, a frame, or another structure configured to support the weight of the cabinet 100 and the contents of the cabinet 100. In at least one embodiment, the cabinet 100 can include a top and bottom surface, one or more sides, one or more doors, or any combination thereof.

In at least one embodiment, a cabinet 100 can include one or more support cups or sockets 110 secured to the support surface 102, one or more legs 120 extending downwardly from the body 104, one or more balls 130, or any combination thereof. In at least one embodiment, each ball 130 can be secured to one of the legs 120 and/or can rest in one of the cups 110. In at least one embodiment, one or more of the balls 130 can be a pivot ball or can otherwise be configured for pivoting in one or more directions relative to a corresponding support cup 100, such as when outside forces or vibrations from a seismic event act on cabinet 100. In at least one embodiment, a cabinet 100, such as for housing electronic equipment, can include four support cups 110, four legs 120, four balls 130, or any combination thereof. In at least one embodiment, one or more of the legs 120 can be secured to one of four bottom corners of the body 104 of the cabinet 100.

In at least one embodiment, one or more of the balls 130 (or "ball(s) 130" for brevity) can be or include a ball member or ball element for cooperating with a corresponding support cup 110 to support cabinet 100 according to the disclosure. In other words, as illustrated in FIGS. 2-15 for exemplary purposes, in at least one embodiment, one or more of the balls 130 can be spherical (i.e., at least substantially spherical) and thus ball-shaped, in the traditional sense of the word "ball." However, this need not be the case and, in at least one embodiment, one or more of the balls 130 can be of a different shape. For example, in at least one embodiment, one or more of the balls 130 can have a hemispherical or semispherical surface for cooperating with the corresponding support cup 110, and the remainder of the ball 130 can be of any shape for coupling with a corresponding leg 120. As another example, in at least one embodiment, one or more of the balls 130 can have one or more otherwise curved or contoured surfaces (which can be symmetrical, asymmetrical, irregularly shaped, or otherwise) for cooperating with the corresponding support cup 110, which can include continuous curvature, discontinuous curvature, a series of linear or otherwise shaped surfaces that approximate a curve, or any combination thereof. Furthermore, each of the balls 130 can be coupled to the corresponding leg 120 statically or dynamically, as required or desired for an implementation of the disclosure. For instance, in at least one embodiment, one or more of the balls 130 can be configured to roll in one or more directions, such as along or otherwise relative to one or more surfaces of the corresponding support cup 110.

In at least one embodiment, one or more of the support cups 110 can include a concave upper surface 112 configured to receive one of the balls 130. In at least one embodiment, one or more of the concave upper surfaces 112 can be symmetrically curved in two dimensions, such as to allow the balls 130, and thus the legs 120, and therefore the cabinet 100 to move relative to the support cups 110. For example, in an earthquake event, the ground may shake, causing the support surface 102 to shake, causing in turn the support cups 110 to shake. By allowing for movement between the support cups 110 and the balls 130, movement between the ground and the cabinet 100 can be allowed, thereby allowing the cabinet 100 to maintain position and stability during a seismic tremor, or a similar event. In at least one embodiment, the weight of the cabinet 100, and/or the cabinet's 100 contents, bias the cabinet 100 towards a desired location, relative to the support surface 102, as the balls 130 come to rest at a lowermost point of the concave upper surfaces 112.

In at least one embodiment, one or more of the support cups 110 can include a one or more stops 114, such as one or more bumps, rims, walls or other retaining structures, configured to retain the ball 130 within the perimeter or other boundary of the concave upper surface 112. In at least one embodiment, one or more of the support cups 110 can include a resilient boot 116 for at least partially sealing the concave upper surface 112 to the cabinet 100. In at least one embodiment, one or more of the support cups 110 can include a lubricant 118, such as within the boot 116. In at least one embodiment, the lubricant 118 can provide lubrication between the ball 130 and the concave upper surface 112 of the support cup 110.

In at least one embodiment, one or more of the legs 120 can be rigid. In at least one embodiment, one or more of the legs 120 can be rigidly affixed to the cabinet 100. In at least one embodiment, one or more of the legs 120 can be rigidly affixed to a bottom surface of the cabinet 100. In at least one embodiment, each of the legs 120 can be rigidly affixed at or to a different corner of the bottom surface of the cabinet 100.

In at least one embodiment, one or more of the legs 120 can be flexible and/or flexibly mounted to the cabinet 100, such as to a corner(s) or other portion(s) of the bottom of the cabinet 100. In at least one embodiment, having the legs 120 be flexible and/or flexibly mounted to the cabinet 100 can allow for a greater range of motion between the ground and the cabinet 100, for a given range of motion between the support cups 110 and the balls 130. In at least one embodiment, such greater range of motion can provide greater seismic resistance.

In at least one embodiment, one or more of the legs 120 can extend downward from the cabinet 100, perpendicular from a bottom surface of the cabinet 100. In at least one embodiment, one or more of the legs 120 can be biased to extend downward from the cabinet 100, perpendicular from a bottom surface of the cabinet 100, by the leg's resiliency. For example, in at least one embodiment, flexible legs 120 can be resilient, such that the leg's 120 resiliency can bias the balls 130 to or towards a position centered within the support cups 110 and/or a lowermost point of each of the concave upper surfaces 112. For instance, in at least one embodiment, one or more of the legs 120 can be made wholly or partially from an elastically deformable material (e.g., rubber, polymer or another elastomer), and the resiliency or elasticity of such material can support biasing the leg 120 and/or the ball 130 towards a normal, rest position relative to the corresponding support cup 110 and can help resist or absorb forces acting on the cabinet 100 during a seismic event.

In at least one embodiment, one or more of the legs 120 can be rigid, and can be flexibly mounted to the cabinet 100 for allowing the rigid leg(s) 120 to transfer force to a flexible mount or mounting assembly to help resist or absorb forces acting on the cabinet 100 during a seismic event. In at least one embodiment, one or more of the legs 120 can be flexibly mounted to the cabinet 100 through or via one or more rotatable or rotating joints 140, such as a ball joint or another joint for allowing flex or movement of the leg 120 relative to the body 104 of the cabinet 100. In at least one embodiment, one or more of the rotating joints 140 can be configured to rotate about one or more axes. In at least one embodiment, two or more of the axes can be parallel. In at least one embodiment, one or more of the rotating joints 140 can be configured to rotate about two perpendicular axes. In at least one embodiment, one or more of the legs 120 can be biased towards a rest position, such as a rest position relative to a corresponding one of the support cups 110. For example, in at least one embodiment, the legs 120 can extend downwardly from the cabinet 100, which can (but need not) include extending in a direction perpendicular (i.e., at least about perpendicular) to a bottom surface or other portion of the cabinet 100. In at least one embodiment, one or more of the legs 120 can be biased towards a rest position by one or more springs 142, one or more rotating joints 140, an elastically deformable material, or any combination thereof.

In at least one embodiment, a cabinet 100, such as for housing electronic equipment, can be mounted to a support surface 102 and can include a body 104 for housing the electronic equipment, four legs 120 extending downwardly from the body 104, four balls 130, four support cups 110 configured to receive one of the balls 130, or any combination thereof. In at least one embodiment, one or more of the legs 120 can be secured to a different bottom corner of the body 104. In at least one embodiment, one or more of the balls 130 can be secured to one of the legs 120. In at least one embodiment, one or more of the support cups 110 can be secured to the support surface 102 in a rectangular pattern, such as matching an on-center spacing of the legs 120. In at least one embodiment, one or more of the support cups 110 can include a symmetrically curved concave upper surface 112 configured to receive one of the balls 130. In at least one embodiment, one or more of the support cups 110 can includes a resilient boot 116 sealing lubricant 118 within the concave upper surface 112. In at least one embodiment, one or more of the legs 120 can be flexibly mounted to the cabinet 100. In at least one embodiment, one or more of the legs 120 can be biased to extend downward from the cabinet 100, such as perpendicular from a bottom surface of the cabinet 100.

In at least one embodiment, a cabinet for housing electronic equipment can be mounted to a support surface and can include a body for housing the electronic equipment, a plurality of support cups secured to the support surface, a plurality of legs extending downwardly from the body, a plurality of balls, or any combination thereof. In at least one embodiment, each ball can be secured to one of the legs and/or can rest in one of the cups. In at least one embodiment, a cabinet for housing electronic equipment can include four support cups, four balls, four legs, or any combination thereof. In at least one embodiment, one or more of the legs can be secured to one of four bottom corners of the body of the cabinet.

In at least one embodiment, one or more of the support cups can include a concave upper surface configured to receive one of the balls. In at least one embodiment, one or more of the concave upper surfaces can be symmetrically curved in two dimensions. In at least one embodiment, one or more of the support cups can include a perimeter rim or other stop configured to retain the ball within the perimeter or other boundary of the concave upper surface. In at least one embodiment, one or more of the support cups can include a resilient boot sealing the concave upper surface to the cabinet. In at least one embodiment, one or more of the support cups can include a lubricant within the boot. In at least one embodiment, the lubricant can provide lubrication between the ball and the concave upper surface.

In at least one embodiment, one or more of the legs can be rigid. In at least one embodiment, one or more of the legs can be rigidly affixed to the cabinet. In at least one embodiment, one or more of the legs can be rigidly affixed to a bottom surface of the cabinet. In at least one embodiment, each of the legs can be rigidly affixed to a different corner of the bottom surface of the cabinet.

In at least one embodiment, one or more of the legs can be flexible and/or flexibly mounted to the cabinet, such as to a different corner of the bottom surface of the cabinet. In at least one embodiment, one or more of the legs can extend downward from the cabinet, perpendicular from a bottom surface of the cabinet. In at least one embodiment, one or more of the legs can be biased to extend downward from the cabinet, perpendicular from a bottom surface of the cabinet, by the leg's resiliency.

In at least one embodiment, one or more of the legs can be rigid and flexibly mounted to the cabinet. In at least one embodiment, one or more of the legs can be flexibly mounted to the cabinet through one or more rotating joints. In at least one embodiment, one or more of the rotating joints can be configured to rotate about one or more axes. In at least one embodiment, two or more of the axes can be parallel. In at least one embodiment, one or more of the rotating joints can be configured to rotate about two perpendicular axes. In at least one embodiment, one or more of the legs can extend downwardly from the cabinet and/or can be perpendicular to a bottom surface or other surface of the cabinet. In at least one embodiment, one or more of the legs can be biased towards a rest position by one or more springs. In at least one embodiment, one or more of the legs can be biased towards a rest position by at least one of a spring, a rotatable joint, an elastomeric portion of the leg, and a combination thereof.

In at least one embodiment, one or more of the balls can include a curved surface configured to contact a corresponding one of the plurality of support cups. In at least one embodiment, the curved surface can be at least partially semispherical. In at least one embodiment, one or more of the balls can be configured to pivot in one or more directions relative to a corresponding one of the plurality of support cups. In at least one embodiment, one or more of the balls can be configured to pivot in multiple directions relative to a corresponding one of the plurality of support cups. In at least one embodiment, one or more of the balls can be configured to roll in one or more directions relative to a corresponding one of the plurality of support cups. In at least one embodiment, one or more of the balls can be configured to roll in multiple directions relative to a corresponding one of the plurality of support cups.

In at least one embodiment, a cabinet for housing electronic equipment can be mounted to a support surface and can include a body for housing the electronic equipment, four legs extending downwardly from the body, four balls, four support cups configured to receive one of the balls, or any combination thereof. In at least one embodiment, one or more of the legs can be secured to a different bottom corner of the body. In at least one embodiment, one or more of the balls can be secured to one of the legs. In at least one embodiment, one or more of the support cups can be secured to the support surface in a rectangular pattern, such as matching an on-center spacing of the legs. In at least one embodiment, one or more of the support cups can include a symmetrically curved concave upper surface configured to receive one of the balls. In at least one embodiment, one or more of the support cups can includes a resilient boot sealing lubricant within the concave upper surface. In at least one embodiment, one or more of the legs can be flexibly mounted to the cabinet. In at least one embodiment, one or more of the legs can be biased to extend downward from the cabinet, such as perpendicular from a bottom surface of the cabinet.

Other and further embodiments utilizing one or more aspects of the disclosure can be devised without departing from the spirit of Applicant's disclosure. For example, the devices, systems and methods can be implemented for numerous different types and sizes in numerous different industries. Further, the various methods and embodiments of the devices, systems and methods can be included in combination with each other to produce variations of the disclosed methods and embodiments. Discussion of singular elements can include plural elements and vice versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicant, but rather, in conformity with the patent laws, Applicant intends to fully protect all such modifications and improvements that come within the scope or range of equivalents of the following claims.

What is claimed is:

1. A cabinet for housing electronic equipment, comprising:

a body for housing the electronic equipment;

a plurality of legs extending downwardly from the body;

a plurality of balls, each of the plurality of balls being secured to a corresponding one of the plurality of legs; and a plurality of support cups configured to be secured to a support surface supporting the cabinet;

wherein each of the plurality of legs is longitudinally rigid and flexibly mounted to the body; and wherein each of the plurality of balls is configured to rest in a corresponding one of the plurality of support cups.

2. The cabinet of claim 1, wherein the plurality of support cups comprises four support cups.

3. The cabinet of claim 1, wherein the plurality of legs comprises four legs, and wherein each of the four legs is secured to a corresponding one of four bottom corners of the body.

4. The cabinet of claim 1, wherein the plurality of balls comprises four balls.

5. The cabinet of claim 1, wherein each of the plurality of support cups includes a concave upper surface configured to receive a corresponding one of the plurality of balls.

6. The cabinet of claim 5, wherein each of the concave upper surfaces is symmetrically curved in two dimensions.

7. The cabinet of claim 5, wherein each of the plurality of support cups includes one or more stops configured to retain the corresponding one of the plurality of balls within a boundary of the concave upper surface.

8. The cabinet of claim 5, wherein each of the plurality of support cups includes a resilient boot that seals the concave upper surface to the body.

9. The cabinet of claim 8, wherein the resilient boot of each of the plurality of support cups further comprises a lubricant within the resilient boot.

10. The cabinet of claim 1, wherein each of the plurality of legs is biased towards a rest position wherein a longitudinal axis of the leg is parallel to a longitudinal axis of the cabinet.

11. The cabinet of claim 1, wherein each of the plurality of legs is flexibly mounted to the cabinet through a corresponding one of a plurality of rotating joints.

12. The cabinet of claim 11, wherein each of the plurality of rotating joints is configured to rotate about a corresponding one of a plurality of axes.

13. The cabinet of claim 12, wherein the plurality of axes are parallel to one another.

14. The cabinet of claim 11, wherein each of the plurality of legs is biased towards a rest position by one or more springs.

15. The cabinet of claim 1, wherein one or more of the plurality of balls comprises a curved surface configured to contact a corresponding one of the plurality of support cups.

16. The cabinet of claim 15, wherein the curved surface is at least partially semispherical.

17. The cabinet of claim 1, wherein each of the plurality of legs is rotatably mounted to the body.

18. The cabinet of claim 1, wherein each of the plurality of legs is longitudinally rigid between the body and the corresponding ball.

19. The cabinet of claim 1, wherein each of the plurality of legs is configured to maintain a fixed linear distance between the corresponding ball and an end of the leg opposite the corresponding ball; and wherein the end of each of the plurality of legs opposite the corresponding ball is configured to rotate about a plurality of axes.

20. A cabinet for housing electronic equipment, comprising:

a body for housing the electronic equipment;

a plurality of legs extending downwardly from the body;

a plurality of balls, each of the plurality of balls being secured to a corresponding one of the plurality of legs; and a plurality of support cups configured to be secured to a support surface supporting the cabinet;

wherein each of the plurality of balls is configured to rest in a corresponding one of the plurality of support cups;

wherein each of the plurality of legs is rigid and is flexibly mounted to the body via a corresponding one of a plurality of rotating joints; and wherein each of the plurality of rotating joints is configured to rotate about two perpendicular axes.

* * * * *